United States Patent
Kuo et al.

(10) Patent No.: US 8,745,547 B1
(45) Date of Patent: Jun. 3, 2014

(54) METHOD FOR MAKING PHOTOMASK LAYOUT

(71) Applicant: United Microelectronics Corp., Hsinchu (TW)

(72) Inventors: Shih-Ming Kuo, Tainan (TW); Ming-Jui Chen, Hsinchu (TW); Te-Hsien Hsieh, Kaohsiung (TW); Cheng-Te Wang, Hsinchu (TW); Jing-Yi Lee, Tainan (TW)

(73) Assignee: United Microelectronics Corp., Hsinchu (TW)

( * ) Notice: Subject to any disclaimer, the term of this patent is extended or adjusted under 35 U.S.C. 154(b) by 0 days.

(21) Appl. No.: 13/940,096

(22) Filed: Jul. 11, 2013

(51) Int. Cl.
    *G06F 17/50* (2006.01)
(52) U.S. Cl.
    USPC .................................................. 716/52
(58) Field of Classification Search
    USPC .................................................. 716/52
    See application file for complete search history.

(56) References Cited

U.S. PATENT DOCUMENTS

| | | | |
|---|---|---|---|
| 6,033,811 A | 3/2000 | Lee | |
| 6,395,438 B1 | 5/2002 | Bruce et al. | |
| 6,470,489 B1 | 10/2002 | Chang et al. | |
| 6,684,382 B2 | 1/2004 | Liu | |
| 6,753,115 B2 | 6/2004 | Zhang et al. | |
| 6,763,514 B2 | 7/2004 | Zhang | |
| 6,852,453 B2 | 2/2005 | Wu | |
| 6,961,920 B2 | 11/2005 | Zach | |
| 7,213,226 B2 | 5/2007 | Kotani et | |
| 7,386,829 B2 | 6/2008 | Lee | |
| 7,412,676 B2 | 8/2008 | Cobb et al. | |
| 7,624,369 B2 | 11/2009 | Graur et al. | |
| 7,945,871 B2 | 5/2011 | Cobb et al. | |
| 2006/0066339 A1* | 3/2006 | Rajski et al. | 324/765 |
| 2006/0085772 A1* | 4/2006 | Zhang | 716/4 |
| 2006/0161452 A1 | 7/2006 | Hess | |
| 2009/0193385 A1 | 7/2009 | Yang et al. | |
| 2009/0278569 A1 | 11/2009 | Taoka et al. | |
| 2009/0300576 A1 | 12/2009 | Huang et al. | |
| 2010/0036644 A1 | 2/2010 | Yang et al. | |
| 2010/0070944 A1 | 3/2010 | Wu et al. | |
| 2010/0086862 A1 | 4/2010 | Yang et al. | |
| 2010/0131914 A1* | 5/2010 | Wu et al. | 716/19 |
| 2010/0175041 A1 | 7/2010 | Krasnoperova et al. | |
| 2011/0029939 A1* | 2/2011 | Yang et al. | 716/55 |

* cited by examiner

*Primary Examiner* — Jack Chiang
*Assistant Examiner* — Mohammed Alam
(74) *Attorney, Agent, or Firm* — J.C. Patents

(57) ABSTRACT

A method for making a photomask layout is disclosed. A graphic data of a photomask is provided. A first correction step is performed to the graphic data. A first verification step is performed to all of the graphic data which has been subjected to the first correction step, wherein at least one failed pattern not passing the first verification step is found. A second correction step is performed to the at least one failed pattern, so as to obtain at least one modified pattern. A second verification step is performed only to at least one buffer region covering the at least one modified pattern, wherein the buffer region has an area less than a whole area of the photomask. Besides, each of the first correction step, the first verification step, the second correction step and the second verification step is executed by a computer.

13 Claims, 3 Drawing Sheets

METHOD FOR MAKING PHOTOMASK LAYOUT

BACKGROUND OF THE INVENTION

1. Field of Invention

The present invention relates to the design and manufacture of an integrated circuit (IC), and particularly to a method for making a photomask layout.

2. Description of Related Art

As the level of integration of integrated circuits is increased, the demand for increasing the feature density or reducing the pitch size becomes the mainstream in the semiconductor industry, and the key technology is in photolithography. In the photolithographic module, the accuracy in the pattern transferring process from a photomask to a wafer is quite important.

When the line-width drops to one half or less of the wavelength of the light source for exposure, several correction and verification steps are required to perform to the whole graphic data of a photomask, so as to reduce the deviation of the critical dimension on the wafer during the pattern transferring process. However, the graphic data system (GDS) file of the photomask used in advanced IC processes easily has a size up to hundreds of gigabytes, so it is very time-consuming to perform the said correction and verification steps.

SUMMARY OF THE INVENTION

Accordingly, the present invention provides a method for making a photomask layout, with which the CPU run time can be greatly reduced.

The present invention provides a method for making a photomask layout. A graphic data of a photomask is provided. A first correction step is performed to the graphic data. A first verification step is performed to all of the graphic data which has been subjected to the first correction step, wherein at least one failed pattern not passing the first verification step is found. A second correction step is performed to the at least one failed pattern, so as to obtain at least one modified pattern. A second verification step is performed only to at least one buffer region covering the at least one modified pattern, wherein the buffer region has an area less than a whole area of the photomask. Besides, each of the first correction step, the first verification step, the second correction step and the second verification step is executed by a computer.

According to an embodiment of the present invention, the buffer region further covers a region optically affected by the at least one modified pattern.

According to an embodiment of the present invention, each of the at least one buffer region is set to have the same shape and size.

According to an embodiment of the present invention, each of the at least one buffer region is set to have a different shape and size.

According to an embodiment of the present invention, the at least one buffer region is set to have an area about 500% larger than an area of the at least one modified pattern.

According to an embodiment of the present invention, the at least one buffer region is determined by an optical model.

According to an embodiment of the present invention, the first verification step includes a design rule check, a lithography rule check or a combination thereof.

According to an embodiment of the present invention, the second verification step includes a design rule check, a lithography rule check or a combination thereof.

According to an embodiment of the present invention, the first verification step and the second verification step include the same type of rule check.

According to an embodiment of the present invention, the first correction step includes an optical proximity correction (OPC).

According to an embodiment of the present invention, the second correction step includes an OPC.

According to an embodiment of the present invention, the first correction step is executed by a first electronic design automation (EDA) tool, the second correction step is executed by a second EDA tool different from the first EDA tool.

According to an embodiment of the present invention, the first correction step, the first verification step, the second correction step and the second verification step form a close loop.

In view of the above, during the photomask layout process, once patterns fail to pass the process rule check and are therefore modified, a verification step of the invention is performed only to the modified patterns but not to the whole graphic data including modified and unmodified patterns. As a result, the CPU run time can be greatly reduced, thereby achieving competitive advantages over competitors.

In order to make the aforementioned and other objects, features and advantages of the present invention comprehensible, a preferred embodiment accompanied with figures is described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF EMBODIMENTS

Figure 1:
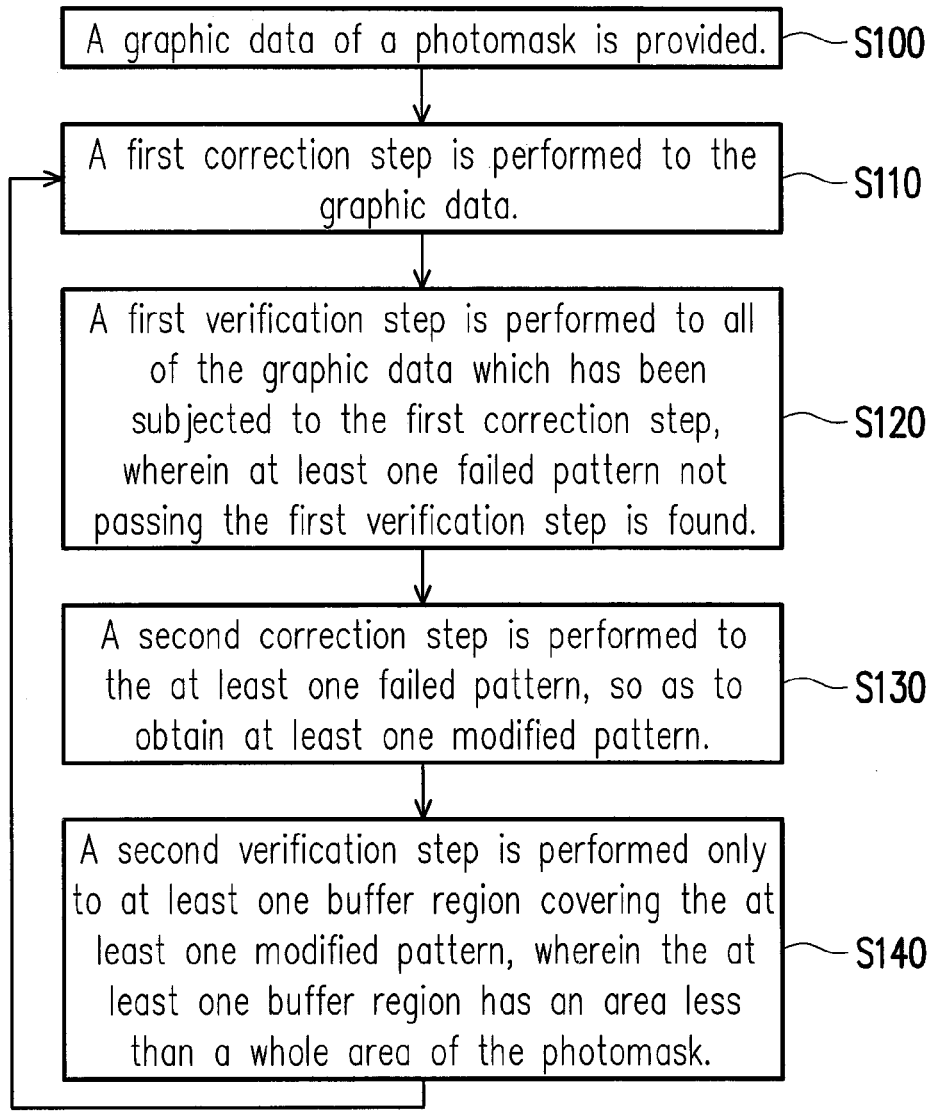
FIG. 1 illustrates a process flow for making a photomask layout according to an embodiment of the present invention.

Reference will now be made in detail to the present preferred embodiments of the invention, examples of which are illustrated in the accompanying drawings. Wherever possible, the same reference numbers are used in the drawings and the description to refer to the same or like parts.

FIG. 1 illustrates a process flow for making a photomask layout according to an embodiment of the present invention. FIG. 2A to FIG. 2D schematically illustrate a method for making a photomask layout according to an embodiment of the present invention.

Referring to FIG. 1, a graphic data of a photomask is provided in the step S100. The graphic data is possibly made by an IC designer and stored in a GDS file. The photomask is used in an IC process for defining a patterned layer of the IC device.

Thereafter, in the step S110, a first correction step is performed to the graphic data. The graphic data which has been subjected to the first correction step is shown as reference numeral 100 in FIG. 2A. The first correction step can be an optical proximity correction (OPC), which may include adding serifs at four corners of a contact hole pattern or adding a hammerhead at an end of a conductive line pattern.

Figure 2A:
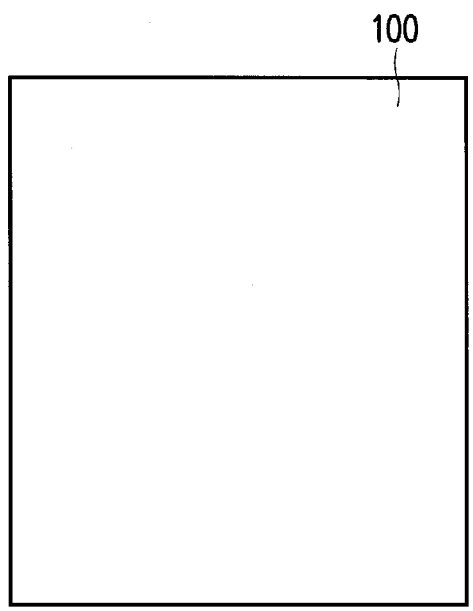
FIG. 2A to FIG. 2D schematically illustrate a method for making a photomask layout according to an embodiment of the present invention.
Figure 2B:
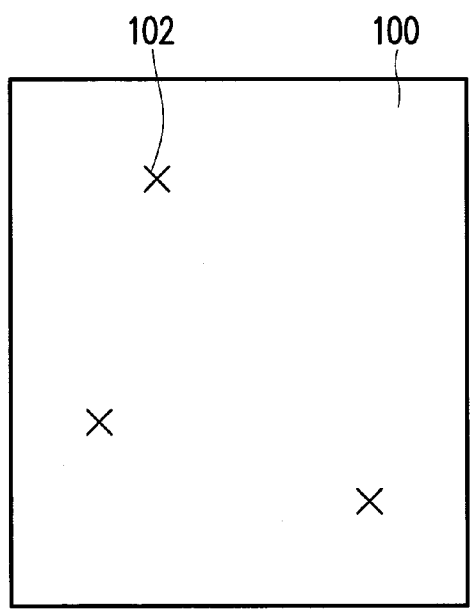

Referring to FIG. 1 and FIG. 2B, in the step S120, a first verification step is performed to all of the graphic data 100 which has been subjected to the first correction step, wherein at least one failed pattern 102 not passing the first verification step is found. In the embodiment of FIG. 2B, three failed patterns 102 are provided for illustration purposes, but are not construed as limiting the present invention. It is appreciated by people having ordinary skill in the art that only one failed pattern or tens of failed patterns may be possible. Besides, the failed patterns 102 can be the same or different with one another.

The first verification step may be a process rule check, which includes a lithography rule check (LRC), a design rule check (DRC), or a combination thereof. The LRC usually includes using numerical integration of a convolution formula to derive the contours of the photomask patterns projected onto the photoresist layer, so as to check if there is any location beyond the lithographic resolution where adjacent patterns are merged in mistake or a single pattern is broken. The DLC usually includes predicting whether the patterns transferred onto the wafer can meet the requirements of the circuit design or not, according to the above calculated projection contours of the patterns and the variables in etching and alignment. The requirements include, for example, sufficient widths for conductive lines, sufficient cross-sectional areas for contact plugs, sufficient overlap areas between conductive lines and contact plugs, prevention of erroneous connection between adjacent patterns due to insufficient etching margin, and so forth. In a case where another photomask is used to define patterns that are at the same level of the patterns defined by the photomask to be manufactured, the requirements may also include prevention of erroneous connection between the patterns defined by the different photomasks due to insufficient alignment/etching margin.

Figure 2C:
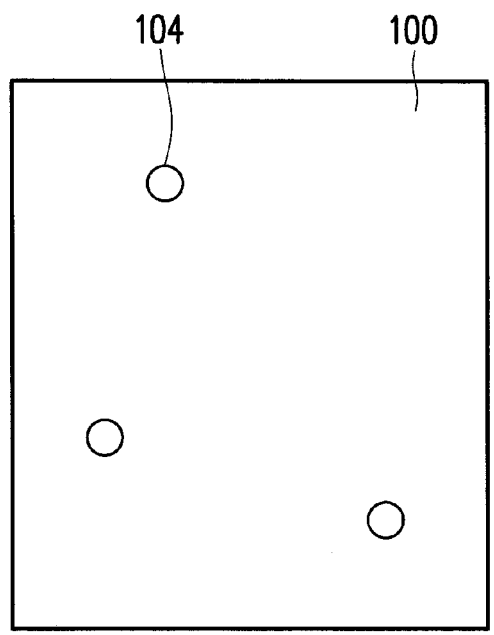

Referring to FIG. 1 and FIG. 2C, in the step S130, a second correction step is performed to the at least one failed pattern 102, so as to obtain at least one modified pattern 104. In other words, after the second correction step, each failed pattern 104 has been corrected to the modified pattern 106 which can pass the process rule check. The second correction step can be an OPC, which may include adding serifs at four corners of a contact hole pattern or adding a hammerhead at an end of a conductive line pattern. It is noted that the OPC used in the second correction step is different from the OPC used in the first correction step. Specifically, the OPC used in the first correction step can be executed by a first electronic design automation (EDA) tool, the OPC used in the second correction step can be executed by a second EDA tool, and the first EDA tool is different from the second EDA tool.

Figure 2D:
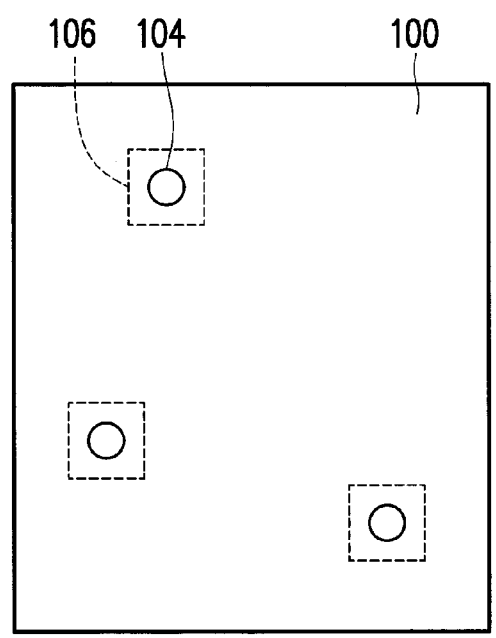

Referring to FIG. 1 and FIG. 2D, in the step S140, a second verification step is performed only to at least one buffer region 106 covering the at least one modified pattern 104, wherein the at least one buffer region 106 has an area less than a whole area of the photomask. The buffer region 106 can further cover a region optically affected by the at least one modified pattern 104. The buffer region 106 can be determined based on an optical model and marked by an EDA tool the same as or different from the EDA tool of the second verification step.

In an embodiment, each of the at least one buffer region 106 can be set to have the same shape and size, as shown in FIG. 2D. For example, each buffer region 106 can be set as a square (1 μm×1 μm) for ensuring all the patterns adjacent to the corresponding modified pattern 104 are checked and verified. In another embodiment (not shown), each of the at least one buffer region 106 can be set to have a different shape and size as long as the region optically affected by the corresponding modified pattern is covered. In yet another embodiment, each of the at one buffer region 106 can be set to have an area about 500% larger than the area of the at least one modified pattern 104. For example, if the error pattern pitch is 100 nm, the buffer region 106 can be set to be larger than 500 nm at least in one direction, such as having an area of greater than 500× 500 nm$^2$.

The second verification step may be a process rule check, which includes a lithography rule check (LRC), a design rule check (DRC), or a combination thereof. The LRC and DRC have been described above, and the details are not iterated herein.

It is noted that in this embodiment, the first verification step and the second verification step include the same type of rule check. In an embodiment, the first and second verification steps are verified by the LRC. In another embodiment, the first and second verification steps are verified by the DRC. In yet another embodiment, the first and second verification steps are verified by both the LRC and DRC.

Besides, unlike the conventional method in which the second verification step is performed to all of the graphic data including the modified patterns and unmodified patterns, the method of the invention performs the second verification step only to the local buffer regions including and around the modified patterns. Therefore, the CPU run time for performing the second verification step can be improved by about 50% or more.

In addition, each of the first correction step, the first verification step, the second correction step and the second verification step is executed by a computer. Besides, the first correction step, the first verification step, the second correction step and the second verification step form a close loop, as shown in FIG. 1. In other words, the step S110 to the step S140 can be performed as many times as needed until the photomask layout meets the customers' requirements.

After the photomask layout of the invention is completed, the following steps such as tape-out, the manufacturing of a photomask based on the photomask layout etc. are well-known to people having ordinary skill in the art, and the details are not iterated herein.

In summary, in the method of this invention, a verification step (e.g. the second verification step) is performed only to the patterns which fail to pass the process rule check (e.g. LRC) and are therefore modified, rather than to the whole graphic data including modified and unmodified patterns. Therefore, the CPU run time for the said verification step can be greatly saved and the process cost can be significantly decreased. Accordingly, the design flow of the photomask layout can be simplified to shorten the period needed for manufacturing the photomask.

The present invention has been disclosed above in the preferred embodiments, but is not limited to those. It is known to persons skilled in the art that some modifications and innovations may be made without departing from the spirit and scope of the present invention. Therefore, the scope of the present invention should be defined by the following claims.

What is claimed is:

1. A method for making a photomask layout, comprising:
providing a graphic data of a photomask;
performing a first correction step to the graphic data;
performing a first verification step to all of the graphic data which has been subjected to the first correction step, wherein at least one failed pattern not passing the first verification step is found;
performing a second correction step to the at least one failed pattern, so as to obtain at least one modified pattern; and performing a second verification step only to at least one buffer region covering the at least one modified pattern, wherein the at least one buffer region has an area less than a whole area of the photomask, wherein each of the first correction step, the first verification step, the second correction step and the second verification step is executed by a computer.

2. The method of claim 1, wherein the buffer region further covers a region optically affected by the at least one modified pattern.

3. The method of claim 1, wherein the at least one buffer region is determined by an optical model.

4. The method of claim 1, wherein each of the at least one buffer region is set to have the same shape and size.

5. The method of claim 1, wherein each of the at least one buffer region is set to have a different shape and size.

6. The method of claim 1, wherein the at least one buffer region is set to have an area 500% larger than an area of the at least one modified pattern.

7. The method of claim 1, wherein the first verification step comprises a design rule check, a lithography rule check or a combination thereof.

8. The method of claim 1, wherein the second verification step comprises a design rule check, a lithography rule check or a combination thereof.

9. The method of claim 1, wherein the first verification step and the second verification step comprise the same type of rule check.

10. The method of claim 1, wherein the first correction step comprises an optical proximity correction (OPC).

11. The method of claim 1, wherein the second correction step comprises an OPC.

12. The method of claim 1, wherein the first correction step is executed by a first electronic design automation (EDA) tool, the second correction step is executed by a second EDA tool different from the first EDA tool.

13. The method of claim 1, wherein the first correction step, the first verification step, the second correction step and the second verification step form a close loop.

\* \* \* \* \*